United States Patent
Chen et al.

(10) Patent No.: US 9,281,203 B2
(45) Date of Patent: Mar. 8, 2016

(54) SILICON DOT FORMATION BY DIRECT SELF-ASSEMBLY METHOD FOR FLASH MEMORY

(71) Applicant: Taiwan Semiconductor Manufacturing Co., Ltd., Hsin-Chu (TW)

(72) Inventors: Chih-Ming Chen, Hsinchu (TW); Cheng-Te Lee, Chupei (TW); Szu-Yu Wang, Hsinchu (TW); Chung-Yi Yu, Hsin-Chu (TW); Chia-Shiung Tsai, Hsin-Chu (TW); Xiaomeng Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/974,155

(22) Filed: Aug. 23, 2013

(65) Prior Publication Data
US 2015/0054059 A1    Feb. 26, 2015

(51) Int. Cl.
| H01L 21/8239 | (2006.01) |
| H01L 21/28 | (2006.01) |
| H01L 29/423 | (2006.01) |
| H01L 29/788 | (2006.01) |
| H01L 29/792 | (2006.01) |
| H01L 29/66 | (2006.01) |

(52) U.S. Cl.
CPC .... *H01L 21/28273* (2013.01); *H01L 29/42328* (2013.01); *H01L 29/42332* (2013.01); *H01L 29/66825* (2013.01); *H01L 29/7881* (2013.01); *H01L 29/66833* (2013.01); *H01L 29/792* (2013.01)

(58) Field of Classification Search
CPC ............ H01L 29/792; H01L 29/66833; H01L 21/28273; H01L 29/42332; H01L 29/66825; H01L 29/7881
See application file for complete search history.

(56) References Cited

U.S. PATENT DOCUMENTS

| 7,045,851 B2 * | 5/2006 | Black et al. ................... 257/315 |
| 7,189,435 B2 * | 3/2007 | Tuominen et al. ............ 427/472 |
| 7,190,049 B2 * | 3/2007 | Tuominen et al. ............ 257/618 |

(Continued)

OTHER PUBLICATIONS

Sungwook Jung, et al.; "Fabrication of Needle-Like Nanostructures Using Block Copolymer for Non-Volatile Memory"; Materials Science and Engineering; www.elsevier.com/locate/msec; C27, 2007, p. 1452-1455.

(Continued)

*Primary Examiner* — Mary Wilczewski
(74) *Attorney, Agent, or Firm* — Eschweiler & Associates, LLC

(57) ABSTRACT

Some embodiments of the present disclosure relate to a method that achieves a substantially uniform pattern of discrete storage elements comprising a substantially equal size within a memory cell. A copolymer solution comprising first and second polymer species is spin-coated onto a surface of a substrate and subjected to self-assembly into a phase-separated material comprising a regular pattern of micro-domains of the second polymer species within a polymer matrix comprising the first polymer species. The first or second polymer species is then removed resulting with a pattern of micro-domains or the polymer matrix with a pattern of holes, which may be utilized as a hard-mask to form a substantially identical pattern of discrete storage elements through an etch, ion implant technique, or a combination thereof.

19 Claims, 9 Drawing Sheets

(56) References Cited

U.S. PATENT DOCUMENTS

| | | | |
|---|---|---|---|
| 7,241,695 B2 | 7/2007 | Mathew et al. | |
| 7,407,554 B2* | 8/2008 | Colburn et al. | 134/37 |
| 7,416,945 B1 | 8/2008 | Muralidhar et al. | |
| 7,572,669 B2* | 8/2009 | Tuominen et al. | 438/99 |
| 7,579,278 B2* | 8/2009 | Sandhu | 438/689 |
| 7,645,694 B2* | 1/2010 | Colburn et al. | 438/619 |
| 7,723,009 B2* | 5/2010 | Sandhu et al. | 430/270.1 |
| 7,763,319 B2* | 7/2010 | Cheng | B05D 5/02 156/246 |
| 7,795,607 B2* | 9/2010 | Min et al. | 257/4 |
| 7,808,020 B2* | 10/2010 | Doris et al. | 257/288 |
| 7,898,850 B2* | 3/2011 | Min et al. | 365/185.03 |
| 7,932,189 B2 | 4/2011 | Merchant et al. | |
| 7,985,686 B2* | 7/2011 | Black et al. | 438/703 |
| 8,105,960 B2* | 1/2012 | Doris et al. | 438/780 |
| 8,114,468 B2* | 2/2012 | Sandhu et al. | 427/98.4 |
| 8,114,573 B2* | 2/2012 | Sandhu et al. | 430/270.1 |
| 8,133,341 B2* | 3/2012 | Nealey et al. | 156/234 |
| 8,133,534 B2* | 3/2012 | Stoykovich et al. | 427/256 |
| 8,168,284 B2* | 5/2012 | Nealey et al. | 428/137 |
| 8,228,743 B2* | 7/2012 | Min et al. | 365/185.28 |
| 8,247,292 B2* | 8/2012 | Black et al. | 438/257 |
| 8,273,665 B2* | 9/2012 | Black et al. | 438/703 |
| 8,287,957 B2* | 10/2012 | Nealey et al. | 427/256 |
| 8,299,455 B2* | 10/2012 | Doris et al. | 257/27 |
| 8,394,483 B2* | 3/2013 | Millward | 428/105 |
| 8,404,124 B2* | 3/2013 | Millward et al. | 216/2 |
| 8,501,304 B2* | 8/2013 | Stoykovich et al. | 428/195.1 |
| 8,512,846 B2* | 8/2013 | Millward | 428/105 |
| 8,513,359 B2* | 8/2013 | Millward | 525/187 |
| 8,518,837 B2* | 8/2013 | Russell et al. | 438/781 |
| 8,592,940 B2* | 11/2013 | Sandhu et al. | 257/506 |
| 8,609,221 B2* | 12/2013 | Millward et al. | 428/119 |
| 8,618,000 B2* | 12/2013 | Raghu et al. | 438/745 |
| 8,623,493 B2* | 1/2014 | Nealey et al. | 428/137 |
| 8,637,113 B2* | 1/2014 | Sandhu et al. | 427/98.4 |
| 8,673,541 B2* | 3/2014 | Xiao et al. | 430/296 |
| 8,685,809 B2* | 4/2014 | Doris et al. | 438/197 |
| 8,785,559 B2* | 7/2014 | Millward | 525/187 |
| 8,802,482 B2* | 8/2014 | Guo et al. | 438/71 |
| 8,834,956 B2* | 9/2014 | Sills et al. | 427/96.1 |
| 8,940,623 B2* | 1/2015 | Gay | H01L 21/28273 257/314 |
| 8,987,138 B2* | 3/2015 | Black et al. | 438/694 |
| 8,993,404 B2* | 3/2015 | Kobrinsky | H01L 28/60 438/396 |
| 9,153,477 B2* | 10/2015 | Nyhus | H01L 21/76811 |
| 2006/0189104 A1 | 8/2006 | Yan | |
| 2008/0156369 A1 | 7/2008 | Ko et al. | |
| 2009/0075002 A1* | 3/2009 | Kim et al. | 428/35.7 |
| 2009/0087664 A1 | 4/2009 | Nealey et al. | |
| 2009/0179001 A1* | 7/2009 | Cheng | B05D 5/00 216/41 |
| 2009/0239334 A1 | 9/2009 | Breitwisch et al. | |
| 2010/0112308 A1 | 5/2010 | Russell et al. | |
| 2011/0256705 A1 | 10/2011 | Kang et al. | |
| 2011/0300699 A1* | 12/2011 | Molas | H01L 21/28282 438/586 |
| 2012/0202017 A1* | 8/2012 | Nealey et al. | 428/195.1 |
| 2012/0217565 A1 | 8/2012 | Gay et al. | |
| 2013/0209757 A1* | 8/2013 | Willson et al. | 428/195.1 |
| 2013/0230705 A1* | 9/2013 | Nealey et al. | 428/201 |
| 2014/0042627 A1* | 2/2014 | Edelstein et al. | 257/758 |
| 2014/0060736 A1* | 3/2014 | Millward et al. | 156/345.3 |
| 2014/0072830 A1* | 3/2014 | Lille et al. | 428/847 |
| 2014/0097520 A1* | 4/2014 | Millward | 257/622 |
| 2014/0205818 A1* | 7/2014 | Schwartz et al. | 428/201 |
| 2014/0329389 A1* | 11/2014 | Matus et al. | 438/703 |
| 2014/0349486 A1* | 11/2014 | Sills et al. | 438/700 |
| 2015/0050794 A1* | 2/2015 | Kim et al. | 438/382 |
| 2015/0054055 A1* | 2/2015 | Chen et al. | 257/324 |
| 2015/0054059 A1* | 2/2015 | Chen et al. | 257/325 |
| 2015/0064915 A1* | 3/2015 | Wuister | 438/700 |

OTHER PUBLICATIONS

Notice of Allowance Dated Feb. 25, 2015 U.S. Appl. No. 13/974,137.

R. Tiron, et al.; "Pattern Density Multiplication by Direct Self Assembly of Block Copolymers: Towards 300mm CMOS Requirements"; Proc. SPIE 8323, Alternative Lithographic Technologies IV, 83230O, Mar. 1, 2012.

Hiroshi Yoshida, et al.; "Improved Lithography by Directed Self-Assembly of Ultra-High-Density Patterns"; SPIE Newsroom, Feb. 7, 2013, p. 1-4.

Takeshi Okino, et al.; "Evaluation of Ordering of Directed Self-Assembly of Block Copolymers with Pre-Patterned Guides for bit Patterned Media"; Proc. SPIE 8323, Alternative Lithographic Technologies IV, 83230S, Mar. 1, 2012.

U.S. Appl. No. 13/974,137 filed Aug. 23, 2013.

Non Final Office Action Dated Dec. 4, 2015 U.S. Appl. No. 14/745,568.

* cited by examiner

400A

400B

400C

SILICON DOT FORMATION BY DIRECT SELF-ASSEMBLY METHOD FOR FLASH MEMORY

BACKGROUND

The following disclosure relates to non-volatile memory (NVM), and more specifically memory cells which utilize a layer of discontinuous storage elements (DSEs) to store charge. Scaling of memory density within such memory cells is dependent upon scaling of the DSEs beyond the resolution limit of optical lithography. Memory device characteristics such as retention and threshold voltage ($V_{TH}$) rely upon uniformity in dimension and spatial distribution of the DSEs.

BRIEF DESCRIPTION OF THE DRAWINGS

FIG. 2C illustrates some embodiments of a method of forming DSEs within a memory device.

DETAILED DESCRIPTION

Figure 1A:
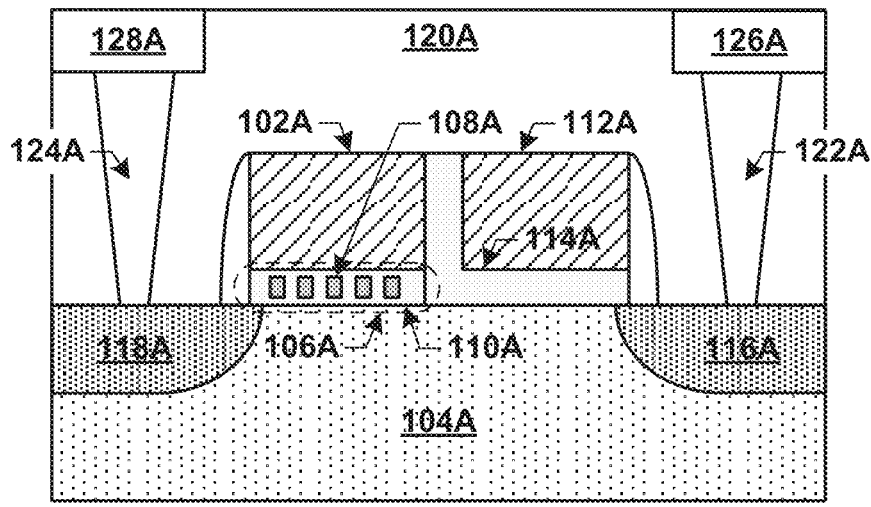
FIGS. 1A-1B illustrate a cross-sectional view of some embodiments of a split-gate thin-film storage (SG-TFS) memory cell and top-down view of a pattern of DSEs within a charge-trapping stack the SG-TFS memory cell.

The description herein is made with reference to the drawings, where like reference numerals are generally utilized to refer to like elements throughout, and where the various structures are not necessarily drawn to scale. In the following description, for purposes of explanation, numerous specific details are set forth in order to facilitate understanding. It is evident, however, that one or more aspects described herein may be practiced with a lesser degree of these specific details. In other instances, known structures and devices are shown in block diagram form to facilitate understanding.

The present disclosure may repeat reference numerals and/or letters in the various examples. This repetition is for the purpose of simplicity and clarity and does not in itself dictate a relationship between the various embodiments and/or configurations discussed. Moreover, the formation of a first feature on a second feature in the description that follows may include embodiments in which the first and second features are formed in direct contact, and may also include embodiments in which additional features may be formed interposing the first and second features, such that the first and second features may not be in direct contact. As an example, a feature formed on a substrate may include features formed on, above, and/or within the substrate.

A split-gate thin-film storage (SG-TFS) memory for embedded non-volatile memory (NVM) in advanced technology nodes comprises a charge-trapping stack of DSEs. The threshold voltage of the SG-TFS memory cell is determined in part by size uniformity and regularity of the DSEs across the cell. Some prior art methods utilize DSEs comprising embedded Si nanocrystals (Si—NCs) which are deposited by an epitaxial growth technique. In some embodiments, a substantially continuous layer of amorphous silicon is deposited by low-pressure chemical vapor deposition (LPCVD) and then exposed to heat, which causes the layer to "ball up" to form the Si—NCs. Other embodiments may use other processing conditions to disassociate the substantially continuous layer into DSEs.

Some epitaxial growth techniques such as LPCVD result in a Gaussian distribution of deposited layer thickness across the surface of the substrate, resulting in a non-uniform distribution of Si—NCs size and space within the charge-trapping layer after the layer disassociates. Variation in Si—NCs size and space drives variable charge storage characteristics between the DSEs, which in turn can drive a non-uniform $V_{TH}$ and degrade device retention. These factors can impact performance and reduce yield for integrated circuits (ICs) utilizing such devices.

Accordingly, some embodiments of the present disclosure relate to a method that achieves a substantially uniform pattern of discrete storage elements comprising a substantially equal size within a memory cell. A copolymer solution comprising first and second polymer species is spin-coated onto a surface of a substrate and subjected to self-assembly into a phase-separated material comprising a regular pattern of micro-domains of the second polymer species within a polymer matrix comprising the first polymer species. The first or second polymer species is then removed resulting with a pattern of micro-domains or the polymer matrix with a pattern of holes, which may be utilized as a hard-mask to form a substantially identical pattern of discrete storage elements through an etch, ion implant technique, or a combination thereof.

The embodiments of the present disclosure provide for a means to continuously scale the cell size of SG-TFS embedded flash memories while achieving a substantially uniform pattern of DSEs. In some embodiments, the methods described herein provide for DSEs within a hexagonal close-packed (HCP) spatial geometry comprising an DSE diameter and HCP minimum space of less than 40 nm, below the lower limit of some prior art optical lithography techniques. FIG. 1A illustrates a cross-sectional view of some embodiments of an SG-TFS memory cell 100A formed in accordance with the embodiments of the present disclosure. The SG-TFS memory cell 100A comprises a control gate (CG) electrode 102A disposed over a surface of a substrate 104A, and separated from the surface by a charge-trapping stack 106A comprising a plurality discrete storage elements (DSEs) 108A disposed within a dielectric material 110A.

In some embodiments, the DSEs 108A comprise polysilicon in a cylindrical shape with a height of less than 200 angstroms. In some embodiments, the DSEs 108A comprise implanted regions of the dielectric material. In some embodiments, the resistivity of the DSEs 108A may be tuned by using various concentrations of n-type or p-type silicon as the dopant.

The SG-TFS memory cell 100A also comprises a select gate (SG) electrode 112A disposed over the surface of the substrate 194A, laterally adjacent the control gate electrode, and separated from the CG electrode 102A and surface by a layer of the dielectric material 114A. In some embodiments, the CG or SG electrode 102A, 112A comprises poly-silicon. In some embodiments, the dielectric material 114A comprises silicon dioxide ($SiO_2$).

The CG electrode 102A and the SG electrode 112A reside between a source 116A and drain 118A of the SG-TFS memory cell 100A, which are defined by doped regions of the substrate 104A. In some embodiments, the substrate 104A comprises silicon (Si) or silicon-on-insulator (SOI). Alternatively, the substrate 102 may comprise another elementary semiconductor. In some embodiments, the source 116A and drain 118A are formed through an ion implantation technique, in which ionized dopant particles (e.g., phosphors, arsenic, antimony, etc.) are accelerated in an electrical field and impacted on the surface of the substrate 104A. An interlayer dielectric (ILD) 120A is formed over the memory cell, and trenches are formed in the ILD 120A and filled with a conductive material to form first and second contacts 122A, 124A from the source and drain 116A, 118A to first and second wiring levels 126A, 128A, respectively.

In some embodiments, programming of the SG-TFS memory cell 100A comprises storing charge within DSEs 108A located on a drain-side (left side) of the charge-trapping stack 106A though hot carrier injection (HCI), by applying appropriate voltages to the CG and SG electrodes 102A, 112A, as well as the drain 118A. As current flows within a channel region of the SG-TFS memory cell 100A in response to these applied voltages, hot carriers are injected from a channel of the device into the drain-side of the charge-trapping stack 106A. In some embodiments, programming of the SG-TFS memory cell 100A comprises storing charge within DSEs 108A located on a source-side (right side) of the charge-trapping stack 106A though source side injection (SSI) through HCl, by changing relative magnitudes of the aforementioned applied voltages. In some embodiments, the source-side and drain-side of the charge-trapping stack 106A are programmed together.

The storage capacity of the SG-TFS memory cell 100A is proportional to the area density of DSEs 108A within the charge-trapping stack 106A, while device performance is driven by uniformity in dimension and spatial distribution of the DSEs 108A. In some embodiments, the SG-TFS memory cell 100A achieves a DSE size and minimum space below the lower limit of that which is achievable by some prior art optical lithography techniques (i.e., a feature critical-dimension of less than 40 nm with a single exposure).

Figure 1B:
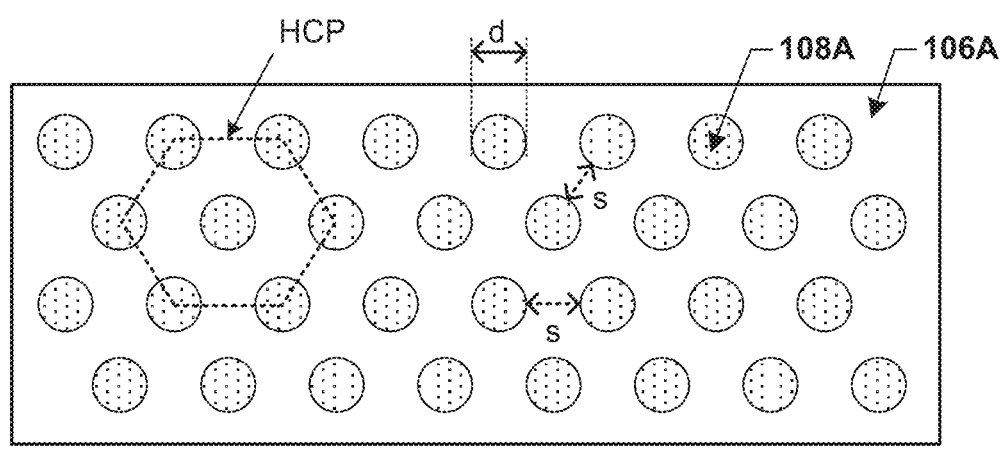

FIG. 1B illustrates a top-down view 100B of a pattern of DSEs 108A within the charge-trapping stack 106A the SG-TFS memory cell 100A. For the embodiments of FIGS. 1A-1B, the DSEs 108A configured in a periodic hexagonal close-packed (HCP) arrangement, and comprise a diameter (d) and minimum space (s) of less than 40 nm.

Figure 2A:
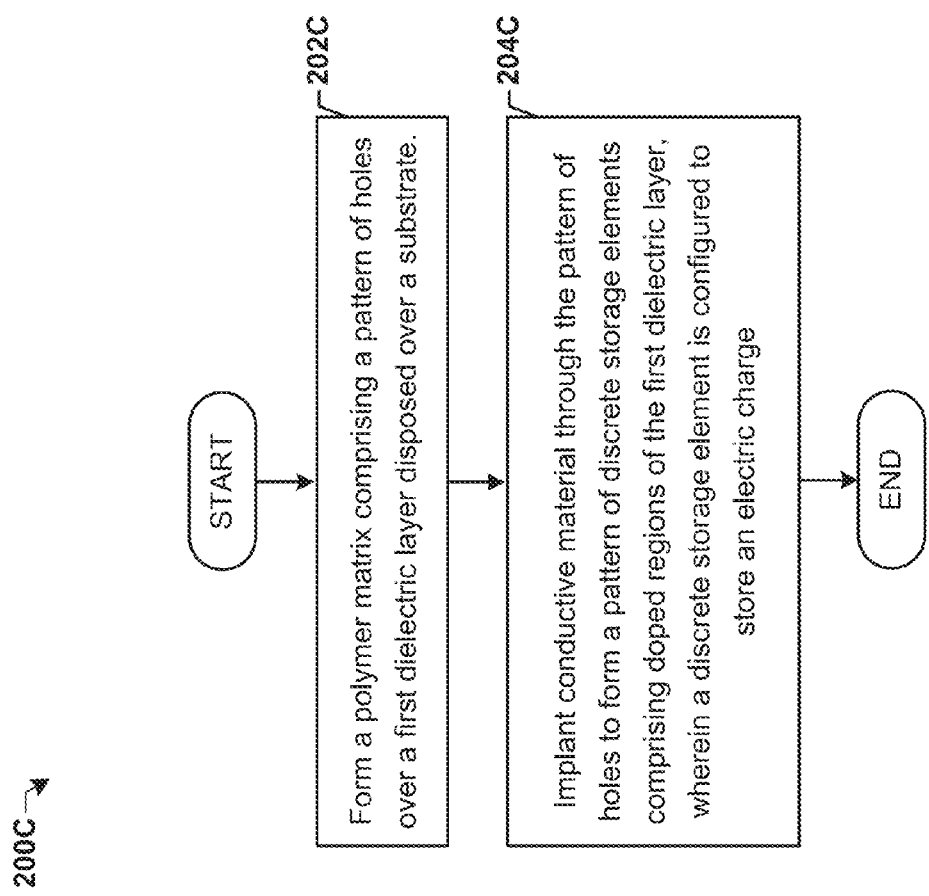
FIGS. 2A-2B illustrate cut out views of some embodiments of DSE patterning within a charge-trapping stack of the SG-TFS memory cell.
Figure 2A:
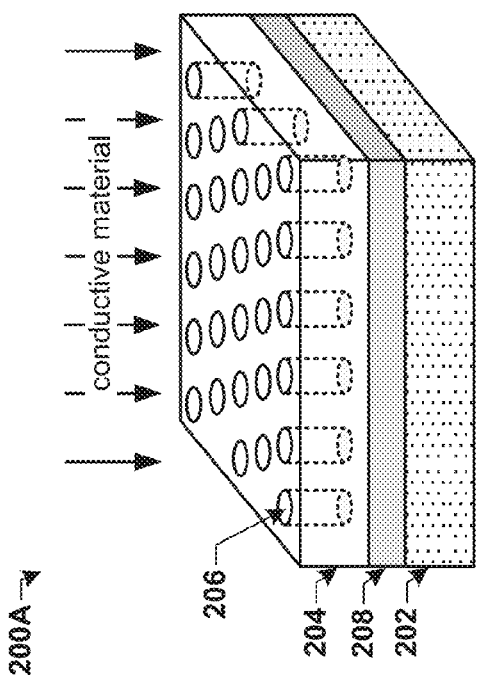

FIG. 2A illustrates a cut out view of some embodiments of a heterostructure 200A utilized for patterning the charge-trapping stack 106A. The heterostructure 200A comprises a substrate 202 (e.g., Si). A patterning stack resides above the substrate 202, and comprises a polymer matrix 204 comprising a pattern of holes 206, disposed above a first dielectric layer 208. The polymer matrix 204 comprises a cylindrical phase block copolymer thin film comprising two polymer species, wherein one of the species has been removed to form the pattern of holes 206.

In some embodiments, the polymer matrix 204 comprises a thickness of less than 1,000 angstroms, and the first dielectric layer 208 comprises silicon dioxide ($SiO_2$) or silicon-rich oxide (SRO) with a thickness of less than 100 angstroms. FIG. 2A also illustrates some embodiments of implanting a conductive material through the pattern of holes 206. In various embodiments, the conductive material may comprise various concentrations of n-type or p-type silicon as the dopant. In some embodiments, implanting the conductive material comprises an n-type Si ion implant with an energy of less than 10 keV and a dose of greater than 1e15 atoms/$cm^2$.

Figure 2B:
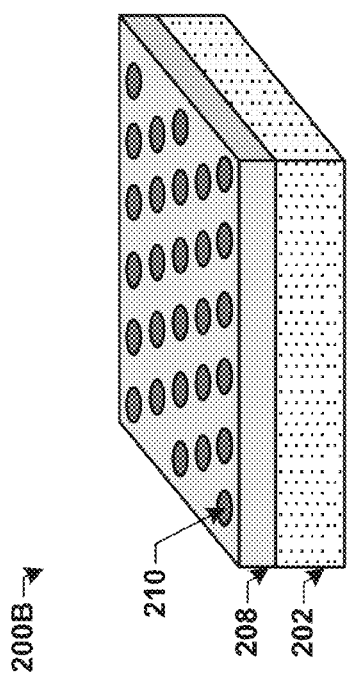

FIG. 2B illustrates a cut out view of some embodiments of a heterostructure 200B comprising the heterostructure 200A, wherein the implanted conductive material has reacted with the first dielectric layer 208 to form a pattern DSEs 210 of the conductive material (e.g., Si—NCs) within the doped region of the substrate, wherein the size and shape if the DSEs are determined by the shape of the doped region, corresponding to the shape of the holes 206 within the polymer matrix 204.

FIG. 2C illustrates some embodiments of a method 200C of forming DSEs within a memory device. While method 200C, and subsequently method 300D, are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202C a polymer matrix comprising a pattern of holes is formed over a first dielectric layer disposed over a substrate. In some embodiments, the substrate comprises silicon. In some embodiments, the first dielectric layer comprises silicon dioxide or a silicon-rich oxide with a thickness of less than 100 angstroms. In some embodiments, the polymer matrix comprises a thickness of less than 1,000 angstroms.

In some embodiments, formation of the polymer matrix comprises spin-coating the substrate with a copolymer solution comprising first and second polymer species, and annealing the substrate which results in a self-assembly of the copolymer solution into a phase-separated material, wherein the first polymer species forms the polymer matrix, and the second polymer species forms a pattern of micro-domains within the polymer matrix. The second polymer species is then removed which replaces the pattern of micro-domains with a substantially identical pattern of first holes within the polymer matrix. In some embodiments, the copolymer solution comprises poly(styrene-block-methylmethacrylate), the first polymer species comprises poly(methyl methacrylate), and the second polymer species comprises polystyrene. In some embodiments, removing the second polymer species comprises an oxygen reactive ion etch (RIE).

At 204C a conductive material is implanted through the pattern of holes, using the polymer matrix as a HM to block implantation in regions other then the pattern of holes, to form a pattern of discrete storage elements comprising doped regions of the first dielectric layer, wherein a discrete storage element is configured to store an electric charge. In some embodiments, the pattern of discrete storage elements comprises a hexagonal close-packed arrangement, and wherein a discrete storage element comprises a round shape corresponding to the hole geometry with a diameter or minimum space of less than 40 nm within the first dielectric layer. In some embodiments, the conductive material comprises silicon, implanting the conductive material comprises an ion implant with an implant energy of less than 10 keV and a dose of greater than 1e15 atoms/$cm^2$ to form DSEs comprising doped silicon within first dielectric layer.

Figure 3A:
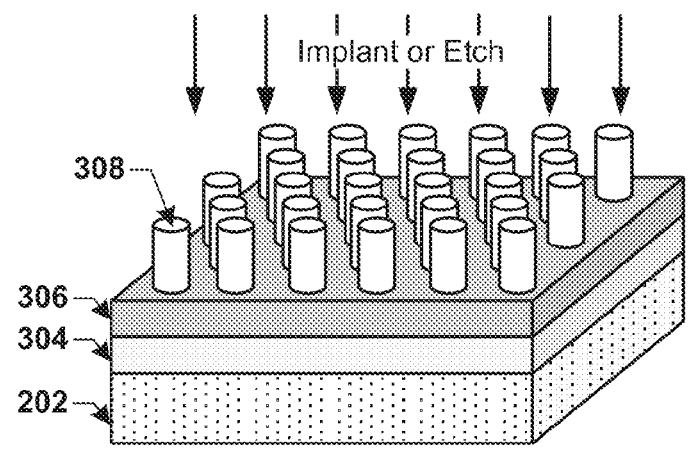
FIGS. 3A-3C illustrate cut out views of some embodiments of DSE patterning within a charge-trapping stack of the SG-TFS memory cell.

FIG. 3A illustrates a cut out view of some embodiments of a heterostructure 300A utilized for patterning the charge-trapping stack 106A. The heterostructure 300A comprises a substrate 202 (e.g., Si), a layer of dielectric material 304 disposed above the substrate 202, and a poly-crystalline layer of substrate material 306 disposed above the layer of dielectric material 304. A pattern of polymer features comprising pillars is formed above the poly-crystalline layer of substrate material 306, wherein a pillar 308 comprises a cylindrical shape, and is formed in a cylindrical phase block copolymer thin film comprising two polymer species, wherein one of the species has been removed to form the pattern of polymer pillars. In some embodiments, the pattern of polymer features comprises holes, or other shapes. The method of formation may comprise the spin-coating technique described in the embodiments of FIG. 2C. However, for the embodiments of FIGS. 3A-3C, the polymer matrix is removed (i.e., the first polymer species), leaving the pattern of micro-domains (i.e., the second polymer species), which forms the pattern of polymer pillars.

In some embodiments, each pillar 308 comprises a thickness of less than 1,000 angstroms, and the poly-crystalline layer of substrate material 306 comprises poly-silicon with a thickness of less than 200 angstroms. In some embodiments, the layer of dielectric material 304 comprises silicon dioxide ($SiO_2$) with a thickness of less than 100 angstroms.

FIG. 3A also illustrates some embodiments of forming DSEs of substrate material within the first layer of substrate material 306 through an implant or etch of the first layer of substrate material 306 by utilizing the pattern of polymer pillars as a HM.

Figure 3B:
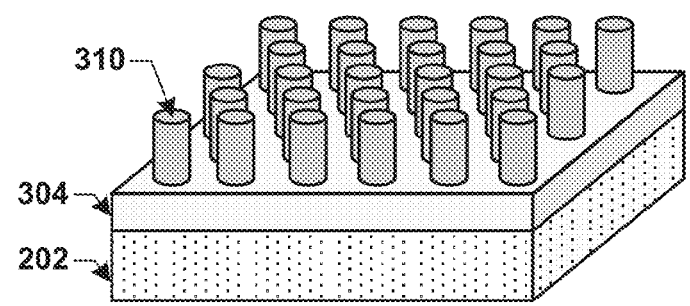

FIG. 3B illustrates cut out view some embodiments of heterostructure 300B, comprising heterostructure 300A wherein a pattern of DSEs have been formed through an etch which removes areas of the poly-crystalline layer of substrate material 306 not blocked by the pattern of polymer pillars (308), leaving a pattern of poly-crystalline pillars of substrate material, wherein a poly-crystalline pillar 310 forms a DSE. The etch may comprise a dry etch (e.g., plasma etch), a wet etch, or a combination thereof.

Figure 3C:
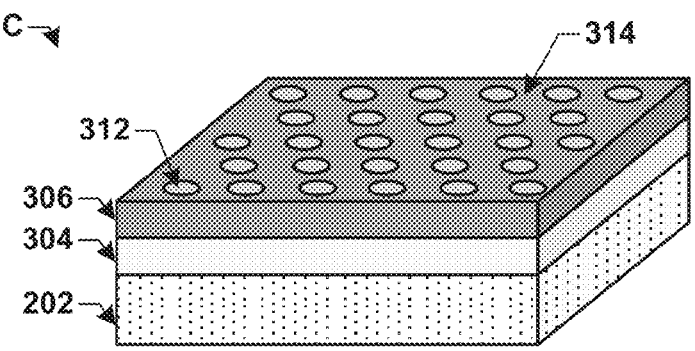

FIG. 3C illustrates cut out view some embodiments of heterostructure 300C, comprising heterostructure 300A wherein a pattern of DSEs have been formed through an oxygen implant. In some embodiments, an $O_2$ ion implant is utilized with the poly-crystalline layer of substrate material 306 comprising poly-silicon, such that the oxygen reacts with the poly-silicon to convert areas of the poly-crystalline layer of substrate material 306 not blocked by a polymer pillar 308 into a matrix 314 of dielectric material comprising $SiO_2$. As a result, areas of the poly-crystalline layer blocked by a polymer pillar 308 remain unaffected, and form DSEs 312 which are isolated from one-another within the matrix 314 of dielectric material.

In some embodiments of FIG. 3C, the oxygen implant further comprises an implant energy of less than 10 keV and a dose of greater than 1e15 atoms/cm$^2$. In some embodiments, the oxygen implant is followed by a thermal anneal to promote diffusion, and/or bonding of SiO2. The thermal anneal may utilize a rapid thermal anneal (RTA), spike, anneal, millisecond anneal (MSA), or laser anneal. A spike anneal operates at peak anneal temperature in the order of second. A MSA operates at peak anneal temperature in the order of milliseconds. A laser anneal operates at peak anneal temperature in the order of micro seconds.

For the embodiments of FIGS. 3A-3C, the pattern of polymer pillars (308), the pattern of poly-crystalline pillars (310), and the pattern of DSEs (312) are substantially identical hexagonal close-packed (HC) patterns, as the pillars (308) are used to form either the pattern of poly-crystalline pillars (310) or the pattern of DSEs (312), depending upon whether an etch or implant is utilized. Therefore, all three patterns comprise a HCP arrangement with a diameter or minimum space of less than 40 nm. For the embodiments of FIG. 3B, the poly-crystalline pillar 310 has a height of less than 200 angstroms, and in general will have a height about equal to the thickness of the poly-crystalline layer of substrate material 306.

Figure 3D:
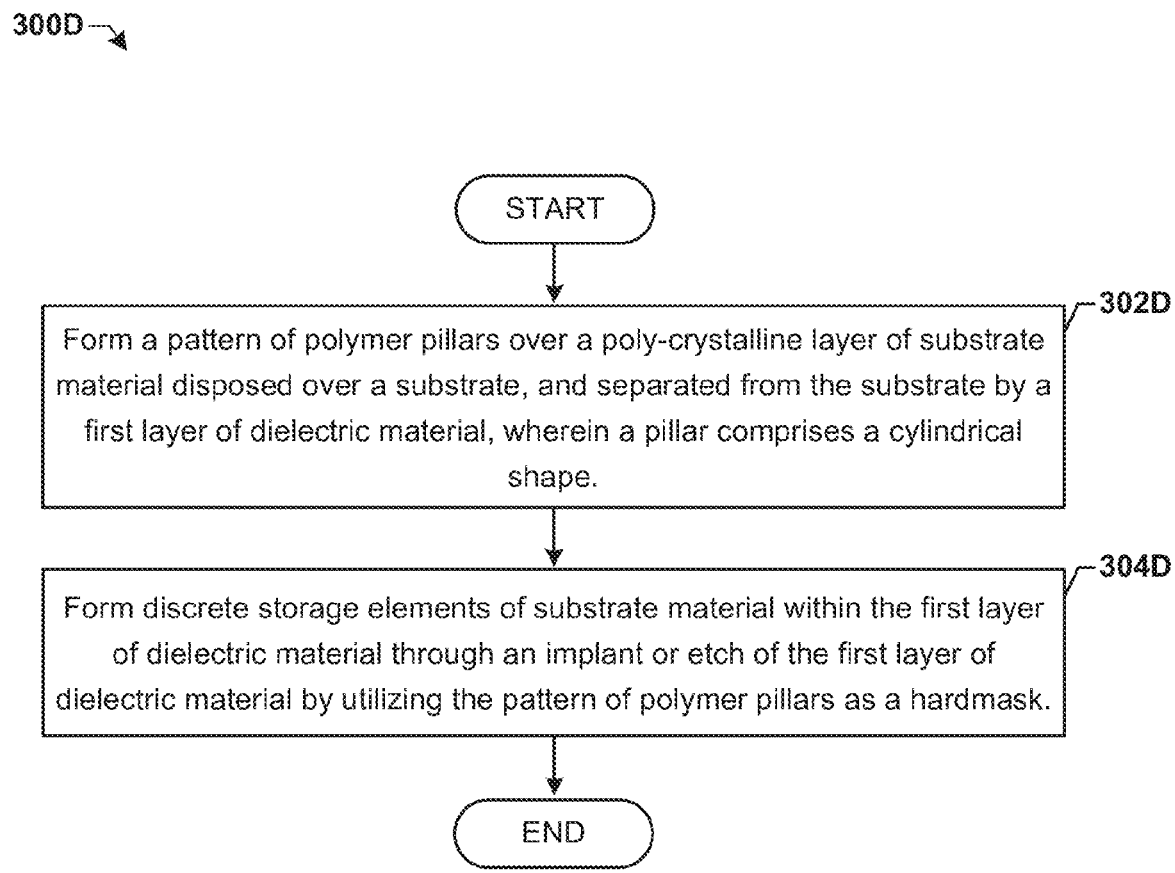
FIG. 3D illustrates some embodiments of a method of forming DSEs within a memory device.

FIG. 3D illustrates some embodiments of a method 300D of forming DSEs within a memory device.

At 302D a pattern of polymer pillars is formed over a poly-crystalline layer of substrate material disposed over a substrate, and separated from the substrate by a first layer of dielectric material, wherein a pillar comprises a cylindrical shape.

At 304D discrete storage elements of substrate material are formed within the first layer of dielectric material through an implant or etch of the first layer of dielectric material by utilizing the pattern of polymer pillars as a hardmask. In some embodiments an oxygen implant is used to convert areas of the poly-crystalline layer not blocked by the pattern of polymer pillars into a matrix of dielectric material. Areas of the poly-crystalline layer blocked by the pattern of polymer pillars remain unaffected and form the DSEs which are isolated from one another by the matrix of dielectric material. In some embodiments an etch removes areas of the poly-crystalline layer not blocked by the pattern of polymer pillars, leaving a pattern of poly-crystalline pillars of substrate material which form pillars of DSEs.

Figure 4A:
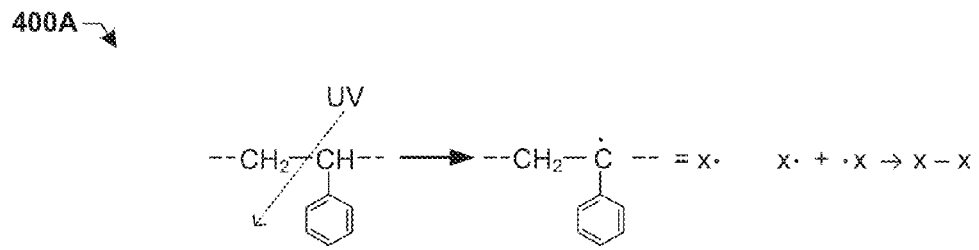
FIGS. 4A-4C illustrate some embodiments of direct self-assembly (DSA) of first and second polymer species within a copolymer solution as a function of volume fraction.
Figure 4B:
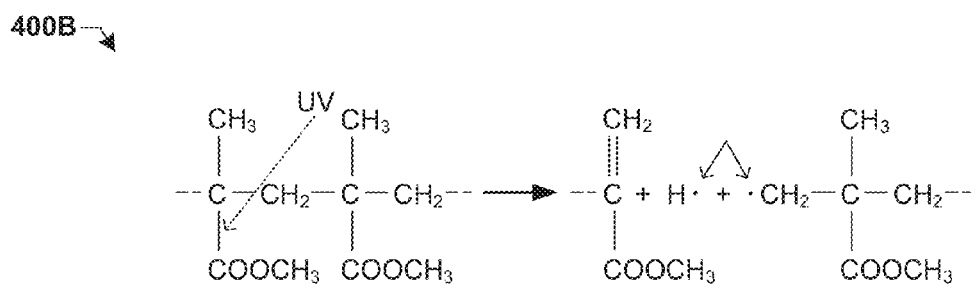

In some embodiments, the copolymer solution comprises poly(styrene-block-methylmethacrylate) (PS-b-PMMA), wherein the first polymer species comprises poly(methyl methacrylate) (PMMA), and the second polymer species comprises polystyrene (PS). In some embodiments, the PS-b-PMMA copolymer is spin-coated onto a substrate, and promoted to self-assemble by thermal annealing or by solvent annealing an inert atmosphere, to achieve a cylindrical phase block copolymer film, wherein the PS forms the polymer matrix, and the PMMA forms the pattern of self-assembled cylindrical micro-domains oriented parallel the surface of the substrate. The copolymer film is then irradiated with ultraviolet (UV) radiation, which promotes cross-linking of the PS molecules through the removal of one hydrogen from a benzene-bonded carbon of the PS polymer chain, such that two PS polymer units 400A or chains of such ionized units may cross-link, as illustrated in FIG. 4A. The UV radiation simultaneously degrades the PMMA polymer unit 400B through the removal of one hydrogen from a methylidene molecule ($CH_2$) bonded to two carbons of the PMMA polymer unit 400B, as illustrated in FIG. 4B. After UV irradiation, the PMMA may be removed through an oxygen (e.g., $O_2$ plasma) RIE.

Figure 4C:
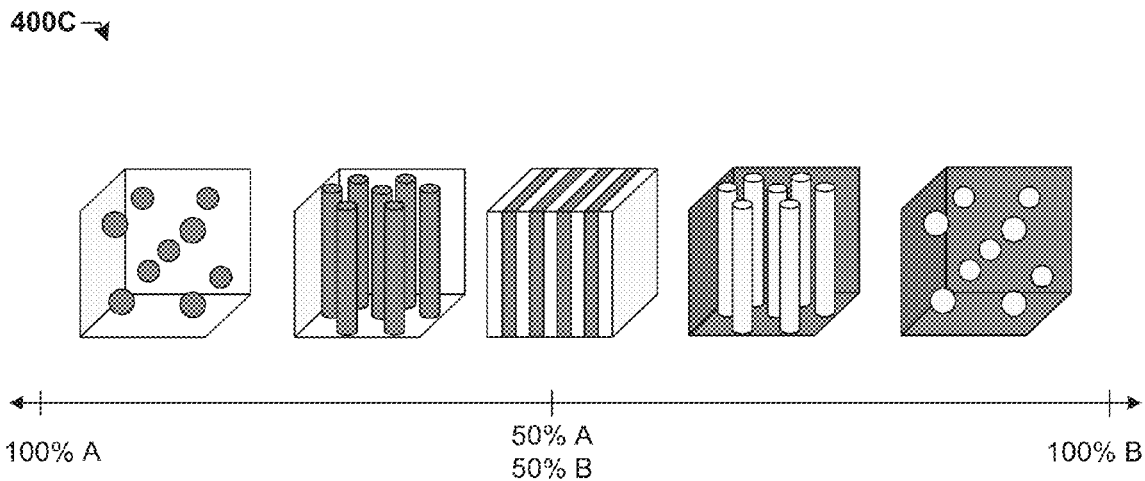

In various embodiments, the PMMA may form the micro-domains within the PS matrix, or the PMMA may form the matrix comprising PS micro-domains. FIG. 4C, illustrates some embodiments of various morphologies 400C of the first and second polymer species, A, B as a function of relative volume fraction. For a nearly equal volume fraction of the first and second polymer species A, B in an equilibrium configuration, a lamellar (layered) copolymer structure is formed. Cylindrical micro-domain structures are formed as the volume fraction of species A or B is decreased relative to species B or A. Spherical micro-domains form when the volume fraction of species A or B is further decreased relative to species B or A. The values of volume fractions that achieve these volume-fraction-dependent morphologies are dependent upon the conditions under which the copolymer was formed (e.g., the annealing conditions) as well as the types of first and second polymer species A, B. For the embodiments of FIGS. 2A-2C and FIG. 3, the polymer matrix 204 comprises PS, and the cylindrical micro-domains comprise PMMA which is removed to form the holes 206.

Figure 5A:
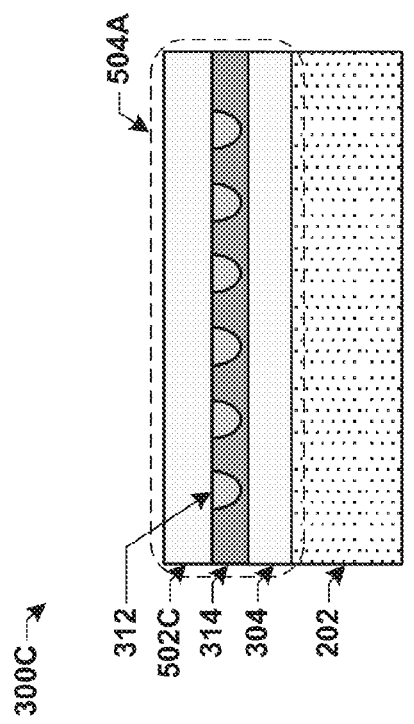
FIGS. 5A-5D illustrate cross-sectional views of some embodiments of memory cell formation by control gate first.

FIGS. 5A-5D illustrate cross-sectional views of some embodiments of memory cell formation by control gate (CG) first. FIG. 5A illustrates a cross-sectional view of the heterostructure 200B formed in the embodiments of FIGS. 2A-2C. Upon formation of heterostructure 200B, a second dielectric layer 502A is formed on the first dielectric layer 208 and DSEs 210, wherein the DSEs 210 and first and second dielectric layers 208, 508A comprise a first charge-trapping stack 504A of the memory device. In some embodiments, the second dielectric layer 502A is formed through a thermal oxidation process to produce silicon dioxide ($SiO_2$).

Figure 5C:
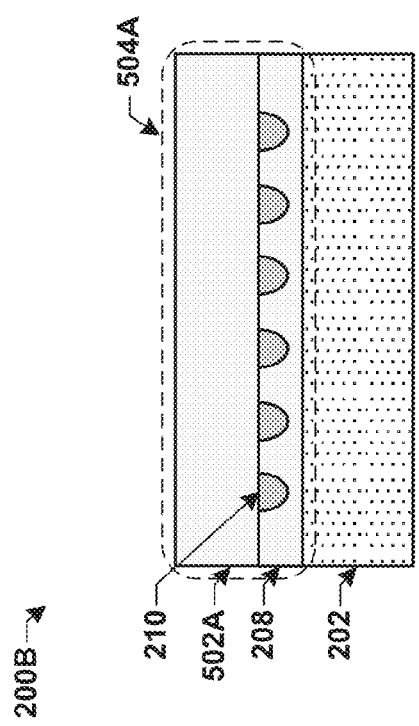
Figure 5B:
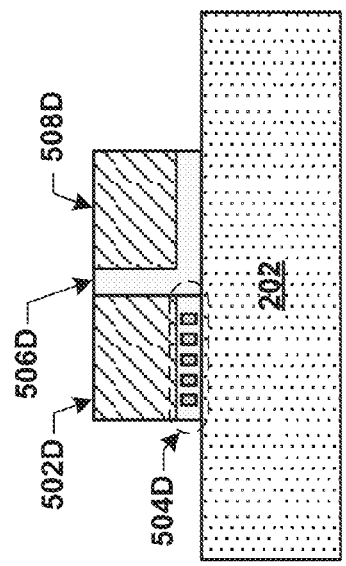

FIG. 5B illustrates a cross-sectional view of the heterostructure 300B formed in the embodiments of FIGS. 3A-3D, wherein a third dielectric layer 502B is formed in a manner similar to second dielectric layer 502A, to define a second charge-trapping stack 504B. The charge-trapping stack 504B comprises the layer of dielectric material 304, poly-crystalline pillars (310), and the third dielectric layer 502B. Similarly, FIG. 5C illustrates a cross-sectional view of the heterostructure 300C formed in the embodiments of FIGS. 3A-2D, wherein a fourth dielectric layer 502C is formed to define a third charge-trapping stack 504B, comprising the layer of dielectric material 304, the DSEs 312 disposed within the matrix 314 of dielectric material, and the fourth dielectric layer 502C.

Figure 5D:
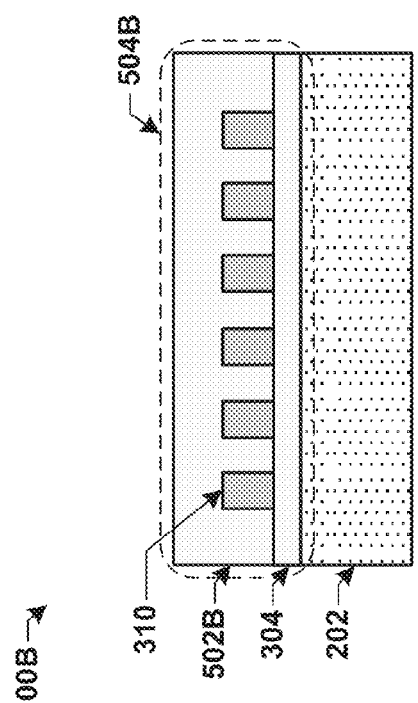

FIG. 5D illustrates a cross-sectional view of a heterostructure 500C, comprising a control gate (CG) electrode 502D disposed over the charge-trapping stack 504D disposed over a substrate 202. In various embodiments, the charge-trapping stack 504D may comprise the first through third charge-trapping stacks 504A-504C of the embodiments of FIGS. 5A-5C. The heterostructure 500C further comprises a fifth dielectric layer 506D disposed over the control gate electrode 502D and surface of the substrate 202. The heterostructure 500C further comprises a select gate (SG) electrode 508D adjacent the CG electrode 502D.

In some embodiments, disposal of the CG electrode 502D occurs after definition of the charge-trapping stack 504D, and comprises deposition of a conductive layer surface of the substrate 202, which is then patterned and etched to form the CG electrode 502D. The CG electrode 502D is configured to control the flow of charges into and out of the charge-trapping stack 504D. In some embodiments, CG electrode 502D comprises a conductive material such as a metal, a metal alloy, a metal compound, a doped semiconductor material (e.g. poly-silicon), or any combination thereof.

In some embodiments, disposal of the SG electrode 508D occurs after disposal of the CG electrode 502D by a pattern and etch process. In some embodiments, the SG electrode 508D comprises a conductive material such as a metal, a metal alloy, a metal compound, a doped semiconductor material (e.g. poly-silicon), or any combination thereof.

Upon formation of the SG electrode 112A, the source 116A and drain 118A of the embodiments of FIGS. 1A-1B are defined, the ILD 120A is formed, and first and second contacts 122A, 124A are formed from the source and drain 116A, 118A to first and second wiring levels 126A, 128A to produce the SG-TFS memory cell 100A.

Figure 6A:
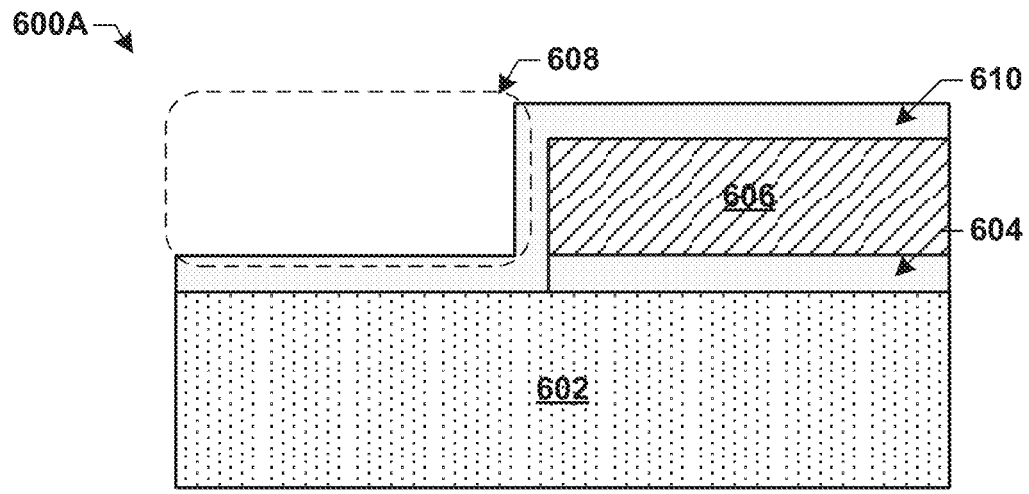
FIGS. 6A-6D illustrate cross-sectional views of some embodiments of memory cell formation by select gate first.

In some embodiments, a memory cell which is equivalent to the SG-TFS memory cell 100A may be produced by other means. FIGS. 6A-6D illustrate cross-sectional views of some embodiments of memory cell formation by select gate (SG) first. FIG. 6A illustrates a cross-sectional view of a heterostructure 600A formed on a substrate 602 (e.g., Si or SOI), wherein a first dielectric layer 604 (e.g., $SiO_2$) is disposed above the substrate 602, and a first conductive layer 606 (e.g., metal, semiconductor, etc.) is disposed, patterned, and etched over a region 608 expose the surface of the substrate within the region 608. A second dielectric layer 610 is then disposed over the patterned substrate 602.

Figure 6B:
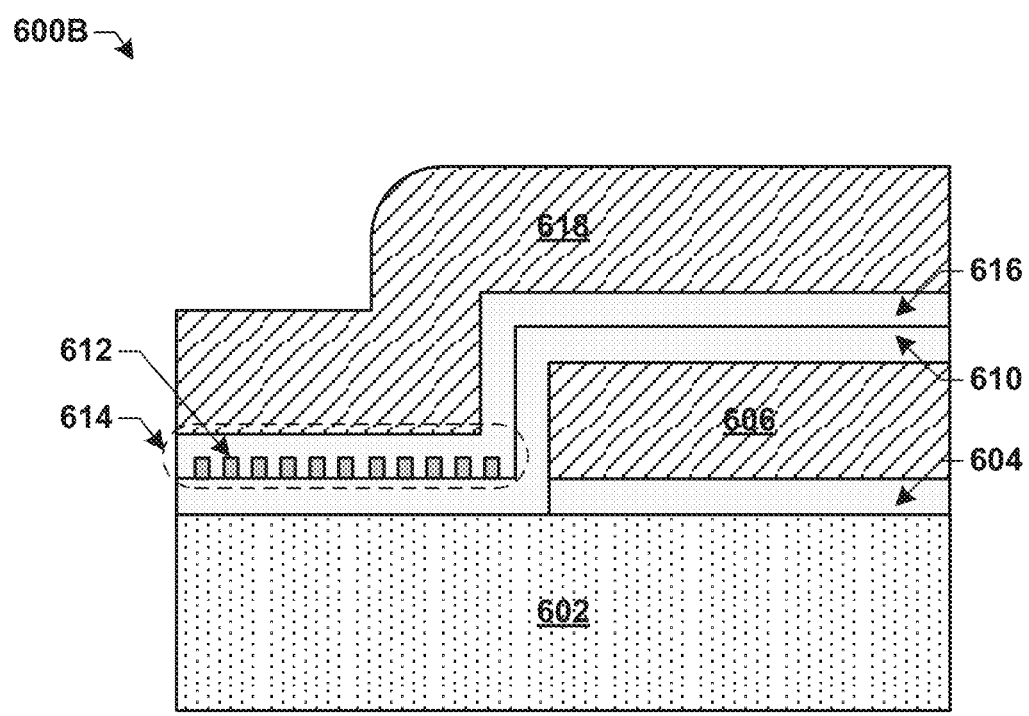

FIG. 6B illustrates a cross-sectional view of a heterostructure 600B, comprising heterostructure 600A wherein a pattern of DSEs 612 is formed, and a third dielectric layer 616 is disposed over the pattern of DSEs 612, encapsulating the pattern of DSEs 612 to form a charge-trapping stack 614. A second conductive layer 618 (e.g., metal, semiconductor, etc.) is then disposed over the third dielectric layer 616. In various embodiments, the charge-trapping stack 614 comprises the first through third charge-trapping stacks 504A-504C of the embodiments of FIGS. 5A-5C, which are formed in a manner as described in the embodiments of FIGS. 2A-2C, and FIGS. 3A-3D.

Figure 6C:
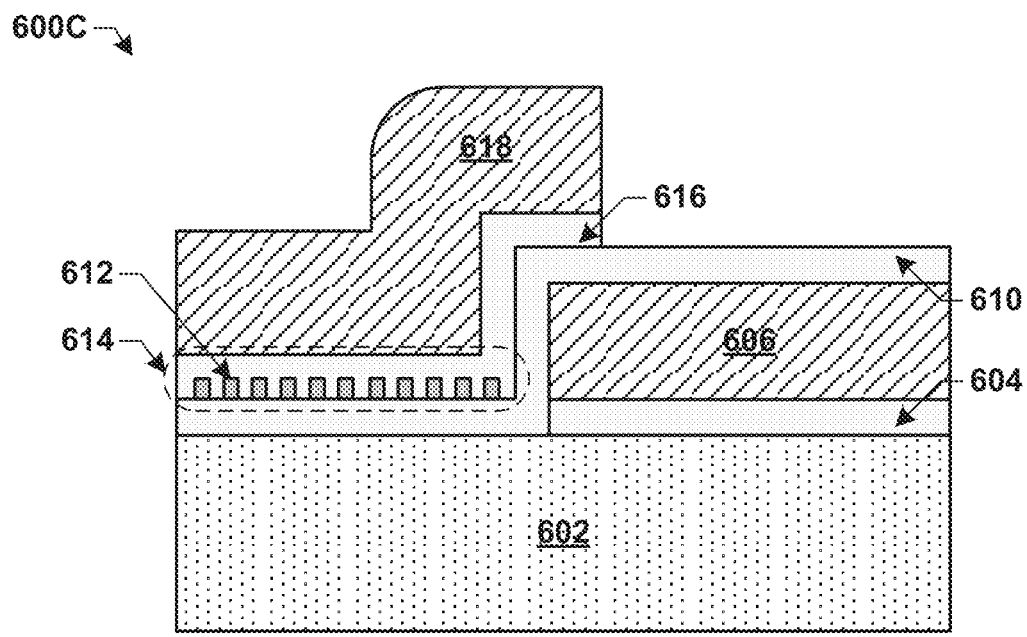

FIG. 6C illustrates a cross-sectional view of a heterostructure 600C, comprising heterostructure 600B wherein a pattern and etch step is performed to remove a portion of the second conductive layer 618 over the first conductive layer 606.

Figure 6D:
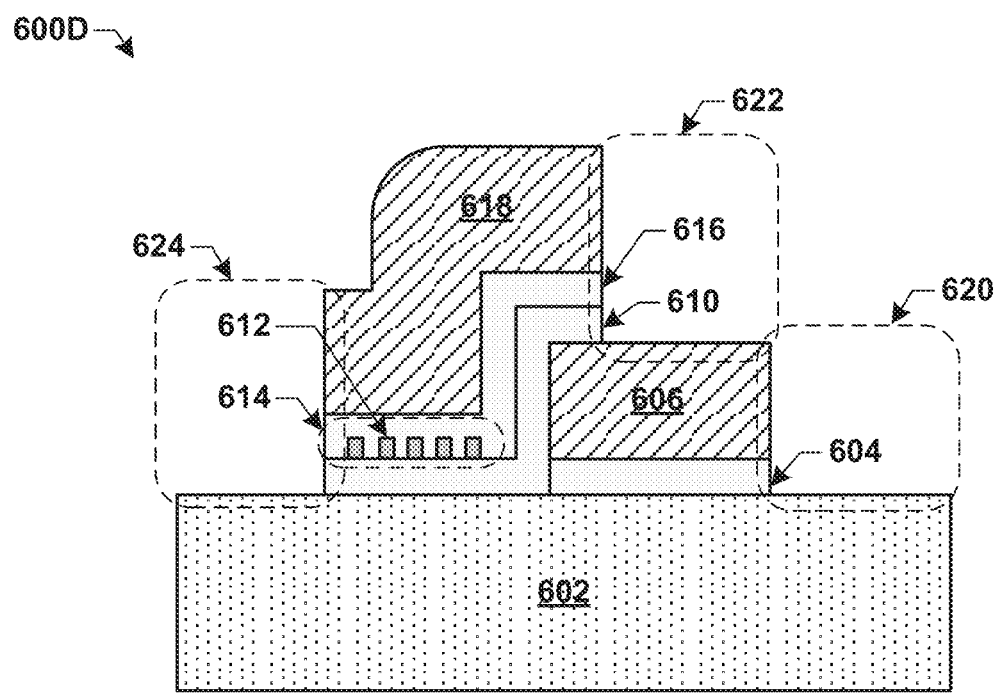

FIG. 6D illustrates a cross-sectional view of a heterostructure 600D, comprising heterostructure 600C wherein a first additional pattern and etch step has been performed to remove a portion of the first conductive layer 606 and first dielectric layer 604 over a source region 620. A second additional pattern and etch step has been performed remove a portion of the second and third dielectric layers 610, 616 above the first conductive layer 606 in a region 622, resulting in the formation of an SG electrode. And, a third additional pattern and etch step has been performed remove portions of the second conductive layer 618, and second and third dielectric layers 610, 616 over a drain region 624, resulting in the formation of a CG electrode.

The embodiments of FIG. 6D define a split-gate structure, which can be further processed to form source and drain regions through an implant or other process, form an ILD, and form contacts to the source and drain regions as well as to the first and second conductive layers 606, 618.

Figure 7:
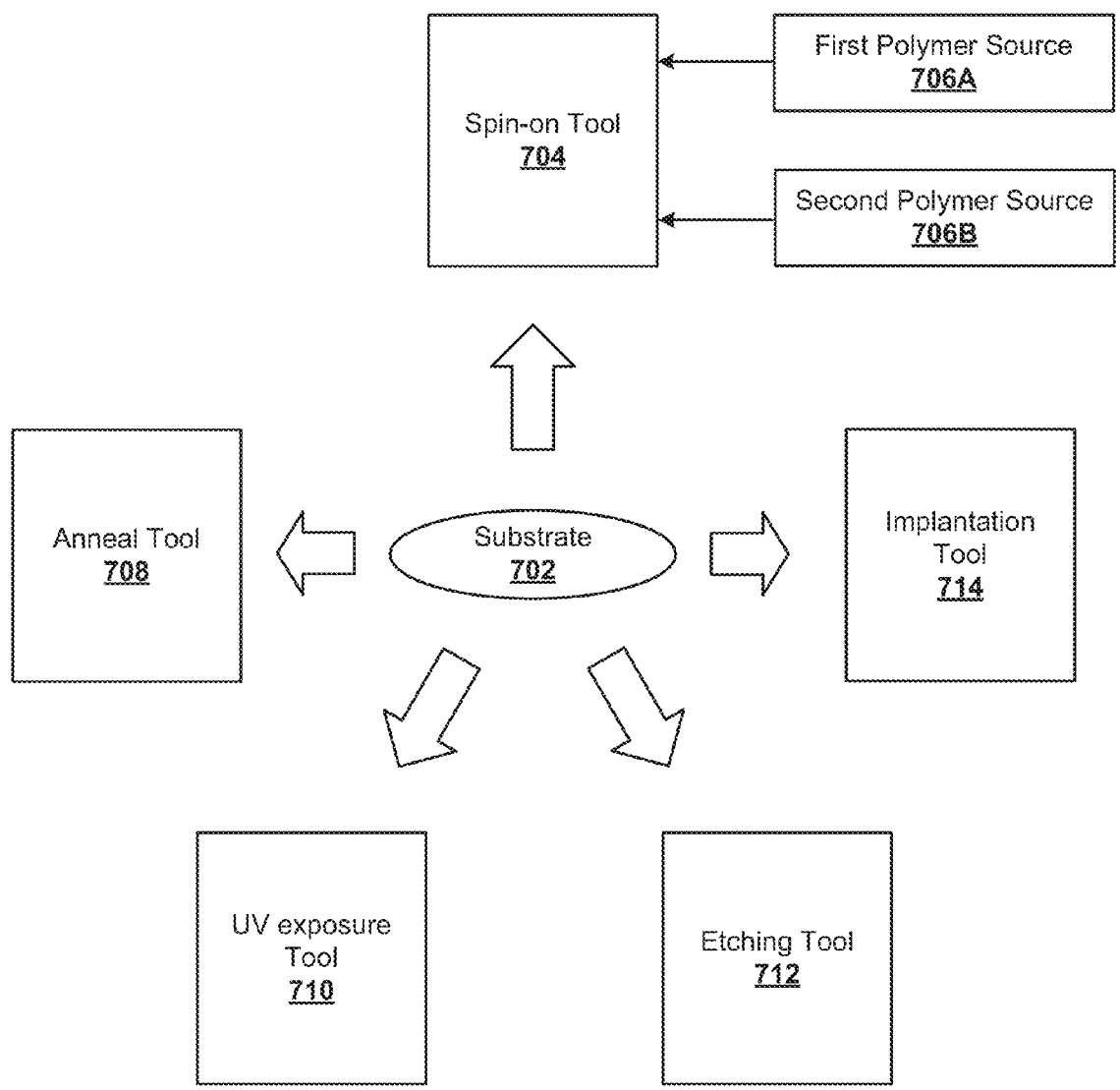
FIG. 7 illustrates some embodiments of a tool arrangement configured to manufacture a memory cell comprising a pattern of DSEs.

FIG. 7 illustrates some embodiments of a tool arrangement 700 configured manufacture a memory cell comprising a pattern of DSEs on a substrate 702. The tool arrangement 700 comprises a spin-on tool 704 configured to receive first and second polymer species 706A, 706B, and spin-coat the substrate with a copolymer solution comprising the first and second polymer species 706A, 706B. The tool arrangement 700 further comprises an anneal tool 708. In some embodiments, the anneal tool 708 comprises an oven configured to subject the substrate 702 thermal annealing. In some embodiments, the anneal tool 708 comprises a solvent annealing tool configured to subject the substrate 702 to an inert atmosphere (e.g., argon, etc.). The anneal tool 708 is configured to achieve DSA of the copolymer film into a polymer matrix comprising the first or second polymer species 706A, 706B occupied by micro-domains comprising the second or first polymer species 706B, 706A, respectively.

The tool arrangement 700 further comprises a UV exposure tool 710 configured to provide UV radiation to the substrate 702. In some embodiments, the UV radiation results in cross-linking of units of the first or second polymer species 706A, 706B, while simultaneously degrading linkage between units of the second or first polymer species 706B, 706A, respectively.

The tool arrangement 700 further comprises an etching tool 712. In some embodiments, the etching tool 712 is configured to subject the substrate 702 to a RIE process (e.g., $O_2$ plasma RIE) to remove the first or second polymer species 706A, 706B from the polymer matrix. In some embodiments, the etching tool 712 is configured to subject the substrate 702 to a dry etch for DSE patterning while utilizing polymer matrix as an HM. In some embodiments, the etching tool 712 is configured to expose the substrate 702 to a continuous flow of one or more dry etchants, wet etchants, or a combination of both. In some embodiments, the etching tool 712 is configured to utilize vapor etchants such as halide gases comprising chlorine $Cl_2$ or hydrogen chloride HCl to perform a selective etch of amorphous or polycrystalline material, while leaving crystalline portions relatively intact. In some embodiments, the etching tool 712 is configured to subject the substrate 702 to etchants such as carbon tetrafluoride (CF4), HF, tetramethylammonium hydroxide (TMAH), or combinations of thereof, for anisotropic etching.

The tool arrangement 700 further comprises an implantation tool 714 configured to implant the substrate 702 with ionized particles. In some embodiments, the ionized particles comprise a silicon-containing dopant, wherein the implantation tool 714 is configured to vary concentrations of n-type or p-type silicon as the dopant to tune the resistivity of the DSEs formed by the ion implantation process. In some embodiments, the implantation tool 714 comprises a vacuum or ultra-low vacuum (UHV) chamber. In some embodiments, the implantation tool 714 is configured to provide the substrate with a thermal anneal after implantation. In some embodiments, the substrate is annealed in the anneal tool 708 after implantation in the implantation tool 714 to provide dopant diffusion and activation.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, some embodiments of the present disclosure relate to a method that achieves a substantially uniform pattern of discrete storage elements comprising a substantially equal size within a memory cell. A copolymer solution comprising first and second polymer species is spin-coated onto a surface of a substrate and subjected to self-assembly into a phase-separated material comprising a regular pattern of micro-domains of the second polymer species within a polymer matrix comprising the first polymer species. The first or second polymer species is then removed resulting with a pattern of micro-domains or the polymer matrix with a pattern of holes, which may be utilized as a hard-mask to form a substantially identical pattern of discrete storage elements through an etch, ion implant technique, or a combination thereof.

In some embodiments, a method of forming discrete storage elements within a memory device is disclosed. The method comprises forming a polymer matrix comprising a pattern of holes over a first dielectric layer disposed over a substrate, and implanting a conductive material through the pattern of holes to form a pattern of discrete storage elements comprising doped regions of the first dielectric layer, wherein a discrete storage element is configured to store an electric charge.

In some embodiments, a method of forming discrete storage elements within a memory device is disclosed. The method comprises forming a pattern of polymer pillars over a poly-crystalline layer of substrate material disposed over a substrate, and separated from the substrate by a first layer of dielectric material, wherein a pillar comprises a cylindrical shape. The method further comprises forming discrete storage elements of substrate material within the first layer of dielectric material through an implant or etch of the first layer of dielectric material by utilizing the pattern of polymer pillars as a hardmask.

In some embodiments, a memory device is disclosed. The memory device comprises a control gate electrode disposed over a surface of a substrate and separated from the surface by a charge-trapping stack comprising a pattern of discrete storage elements of substrate material disposed within a dielectric material, wherein the pattern of a discrete storage elements further comprise a hexagonal close-packed arrangement with a diameter or minimum space of less than 40 nm. The memory device further comprises a select gate electrode disposed over the surface of the substrate and laterally adjacent the control gate electrode, and separated from the control gate electrode and surface by a layer of the dielectric material. In some embodiments, the discrete storage elements comprise poly-silicon in a cylindrical shape with a height of less than 200 angstroms. In some embodiments, the discrete storage elements comprise implanted regions of the dielectric material.

What is claimed is:

1. A method of forming discrete storage elements within a memory device, comprising:
   disposing a first dielectric material over a substrate;
   disposing a poly-crystalline layer over the first dielectric material;
   forming a pattern of polymer features over the poly-crystalline layer, wherein each feature comprises a cylindrical shape; and
   forming a pattern of discrete storage elements within the poly-crystalline layer through an implant or etch of the poly-crystalline layer by utilizing the pattern of polymer features as a hardmask.

2. The method of claim 1, wherein forming the discrete storage elements comprises performing an oxygen implant, wherein the oxygen reacts with the poly-crystalline layer to convert areas of the poly-crystalline layer not blocked by the pattern of polymer features into a matrix of dielectric material, and wherein areas of the poly-crystalline layer blocked by the pattern of polymer features remain substantially unimplanted to form the discrete storage elements which are isolated from one another by the matrix of dielectric material.

3. The method of claim 1, wherein the poly-crystalline layer and the substrate comprise a same semiconductor material.

4. The method of claim 3, wherein the semiconductor material comprises silicon and the dielectric material comprises silicon dioxide.

5. The method of claim 1, wherein the pattern of discrete storage elements comprises a hexagonal close-packed arrangement, and wherein a discrete storage element comprises the cylindrical shape.

6. The method of claim 1, wherein forming the discrete storage elements comprises an etch, wherein the etch removes areas of the poly-crystalline layer not blocked by the pattern of polymer features, leaving a pattern of poly-crystalline features of substrate material which form the discrete storage elements.

7. The method of claim 1, wherein forming the pattern of polymer features comprises:
 spin-coating the substrate with a copolymer solution comprising first and second polymer species;
 annealing the substrate which results in a self-assembly of the copolymer solution into a phase-separated material, wherein the first polymer species forms a polymer matrix, and the second polymer species forms a pattern of micro-domains within the polymer matrix; and
 removing the first polymer species which removes the polymer matrix and leaves the micro-domains of the second polymer species comprising the pattern of polymer features.

8. The method of claim 7, wherein:
 the copolymer solution comprises poly(styrene-block-methylmethacrylate); and
 the first or second polymer species comprise polystyrene or poly(methyl methacrylate).

9. The method of claim 7, wherein removing the first polymer species comprises an oxygen reactive ion etch, which selectively removes the first polymer species while leaving the second polymer species substantially intact.

10. The method of claim 7, further comprising:
 forming a second dielectric material on the first dielectric material and the discrete storage elements, wherein the discrete storage elements and first and second dielectric materials comprise a charge-trapping stack of the memory device;
 disposing a control gate electrode over the charge-trapping stack;
 disposing a third dielectric material over the control gate electrode and surface of the substrate; and
 disposing a select gate electrode adjacent the control gate electrode.

11. A method, comprising:
 disposing a copolymer solution comprising first and second polymer species over an upper surface of a substrate;
 annealing the copolymer solution to form a phase-separated layer in which the first polymer species forms a first pattern and the second polymer species forms a second pattern, wherein the first and second patterns collectively cover the upper surface of the substrate;
 removing the first polymer species from over the upper surface, while leaving the second polymer species substantially intact to form a hard mask comprising the second pattern; and
 implanting a dopant into the upper surface of the substrate, while using the second pattern to block the implantation, to form a plurality of discrete data storage elements within the substrate.

12. The method of claim 11, further comprising:
 implanting the substrate with a conductive material through the upper surface, while using the second pattern to block the implantation of the conductive material into the upper surface, thereby forming a pattern of the plurality of discrete data storage elements within the substrate that is substantially identical to the first pattern.

13. The method of claim 11, further comprising:
 forming a layer of conductive material over the substrate;
 forming the hard mask comprising the second pattern over the layer of conductive material; and
 implanting the substrate with a non-conductive material through the upper surface, while using the second pattern to block implantation of the non-conductive material into the upper surface, thereby forming a pattern of the non-conductive material within the substrate that is substantially identical to the first pattern;
 wherein the non-conductive material reacts with the conductive material to form a pattern of dielectric material that is substantially identical to the first pattern; and
 wherein regions of the conductive material that are blocked by the second pattern remain conductive after the implant to form a pattern of the discrete data storage elements within the substrate that is substantially identical to the second pattern.

14. The method of claim 11, further comprising:
 forming a conductive layer over the substrate; and
 implanting a non-conductive material into some regions of the conductive layer, while using the second polymer species to block implantation of the non-conductive material into the conductive layer.

15. A method, comprising:
 providing a copolymer solution comprising first and second polymer species over a substrate;
 annealing the substrate and the copolymer solution, which results in a self-assembly of the copolymer solution into a phase-separated material, wherein the first polymer species forms a polymer matrix, and the second polymer species forms a second polymer pattern within the polymer matrix;
 removing the second polymer species from the polymer matrix, which replaces the second polymer pattern with a substantially identical pattern of holes within the polymer matrix; and
 implanting a dopant into the substrate using the polymer matrix having the holes therein as a hard mask to block the dopant and to form a plurality of discrete data storage elements within the substrate.

16. The method of claim 15, wherein the second polymer pattern comprises a hexagonal close-packed arrangement, and wherein a hole has a cylindrical shape.

17. The method of claim 16, wherein the hole has a diameter of less than 40 nm.

18. The method of claim 15,
 wherein the copolymer solution comprises poly(styrene-block-methylmethacrylate);
 wherein the first polymer species comprises poly(methyl methacrylate); and
 wherein the second polymer species comprises polystyrene.

19. The method of claim 15, wherein removing the second polymer species comprises a selective etch, which selectively removes the second polymer species while leaving the first polymer species substantially intact to form the polymer matrix.

* * * * *